US012575223B2

(12) United States Patent
Tonkikh

(10) Patent No.: US 12,575,223 B2
(45) Date of Patent: Mar. 10, 2026

(54) OPTOELECTRONIC SEMICONDUCTOR CHIP

(71) Applicant: OSRAM Opto Semiconductors GmbH, Regensburg (DE)

(72) Inventor: Alexander Tonkikh, Wenzenbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 529 days.

(21) Appl. No.: 17/629,035

(22) PCT Filed: Jul. 17, 2020

(86) PCT No.: PCT/EP2020/070332
§ 371 (c)(1),
(2) Date: Jan. 21, 2022

(87) PCT Pub. No.: WO2021/013740
PCT Pub. Date: Jan. 28, 2021

(65) Prior Publication Data
US 2022/0271192 A1 Aug. 25, 2022

(30) Foreign Application Priority Data
Jul. 24, 2019 (DE) ..................... 10 2019 119 991.3

(51) Int. Cl.
*H10H 20/812* (2025.01)
*H10H 20/811* (2025.01)
(Continued)

(52) U.S. Cl.
CPC ...... *H10H 20/812* (2025.01); *H10H 20/8242* (2025.01); *H10H 20/811* (2025.01); *H10H 20/815* (2025.01); *H10H 20/824* (2025.01)

(58) Field of Classification Search
CPC ... H01L 33/06; H01L 33/305; H01L 33/0025; H01L 33/12; H01L 33/14; H01L 33/30;
(Continued)

(56) References Cited

U.S. PATENT DOCUMENTS 6,072,196 A * 6/2000 Sato ..................... H01S 5/34326
257/97
2002/0104996 A1* 8/2002 Kuo ..................... H10H 20/013
257/89
(Continued)

FOREIGN PATENT DOCUMENTS

CN 106129196 A * 11/2016 ........... H10H 20/824
JP 2001015805 A 1/2001
JP 2002353502 A * 12/2002

OTHER PUBLICATIONS

CN_106129196_A_I_English (Year: 2016).*
(Continued)

*Primary Examiner* — Yara B Green
*Assistant Examiner* — Akhee Sarker-Nag
(74) *Attorney, Agent, or Firm* — MH2 Technology Law Group LLP

(57) ABSTRACT

In one embodiment, the invention relates to an optoelectronic semiconductor chip comprising a semiconductor layer sequence. The semiconductor layer sequence has an n-conducting first layer region, a p-conducting second layer region and an active zone lying therebetween for generating radiation. The second layer region comprises a first subregion directly adjacent to the active zone, the first subregion being composed of p-conducting InAl1-vP. The second layer region also comprises a second subregion directly adjacent to the first subregion, the second subregion having p-conducting Iny(GaxAl1-x)1-yP. The second layer region also comprises a third subregion as a p-contact layer directly adjacent to the second subregion.

20 Claims, 5 Drawing Sheets

(51) Int. Cl.
  *H10H 20/815*   (2025.01)
  *H10H 20/824*   (2025.01)
(58) Field of Classification Search
  CPC .. H01L 33/04; H10H 20/812; H10H 20/8242;
      H10H 20/811; H10H 20/815; H10H
          20/824; H10H 20/816
  See application file for complete search history.

(56)       References Cited

U.S. PATENT DOCUMENTS

| | | | |
|---|---|---|---|
| 2018/0240936 A1* | 8/2018 | Hong | .................... H10H 20/815 |
| 2019/0148601 A1* | 5/2019 | Park | ..................... H10H 20/824 |
| | | | 257/88 |

OTHER PUBLICATIONS

JP_2002353502_A_I_English (Year: 2002).*
International Search Report (with English Translation) and Written
Opinion in corresponding International Application No. PCT/EP2020/
070332 mailed on Oct. 23, 2020, 15 pages.
German office Action issued in corresponding German Patent
Application No. 10 2019 119 991.3 dated Jun. 5, 2025, with English
language translation, 16 pages.

* cited by examiner

FIG 1
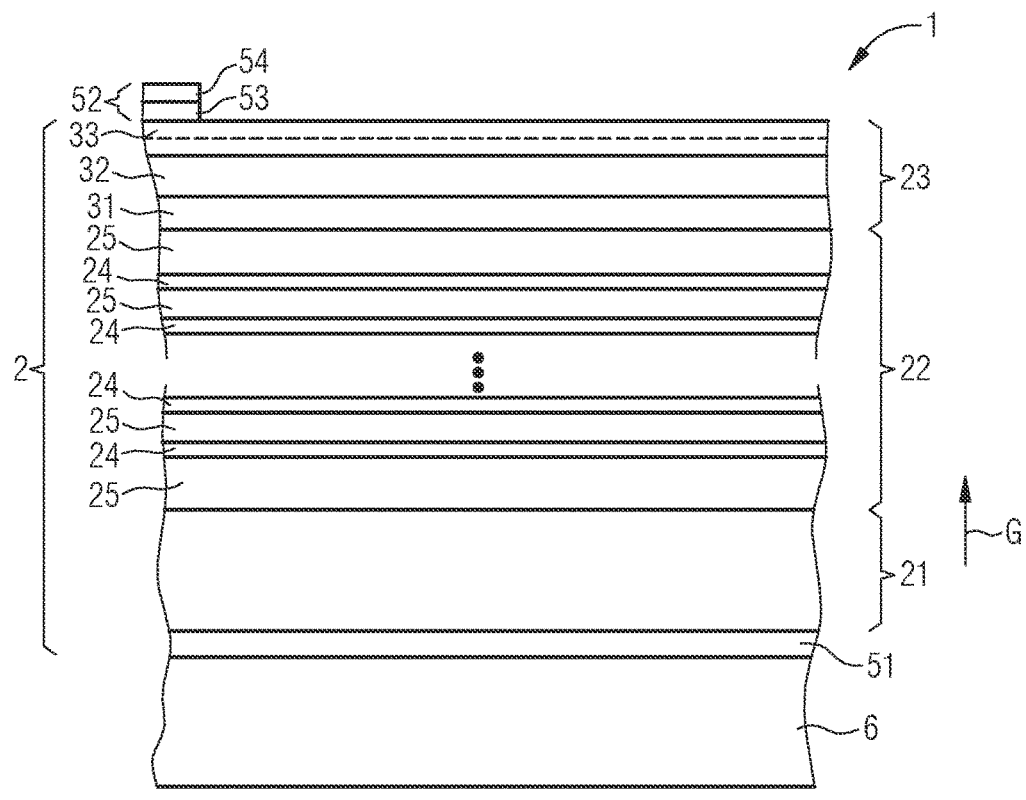
FIG 2
FIG 3
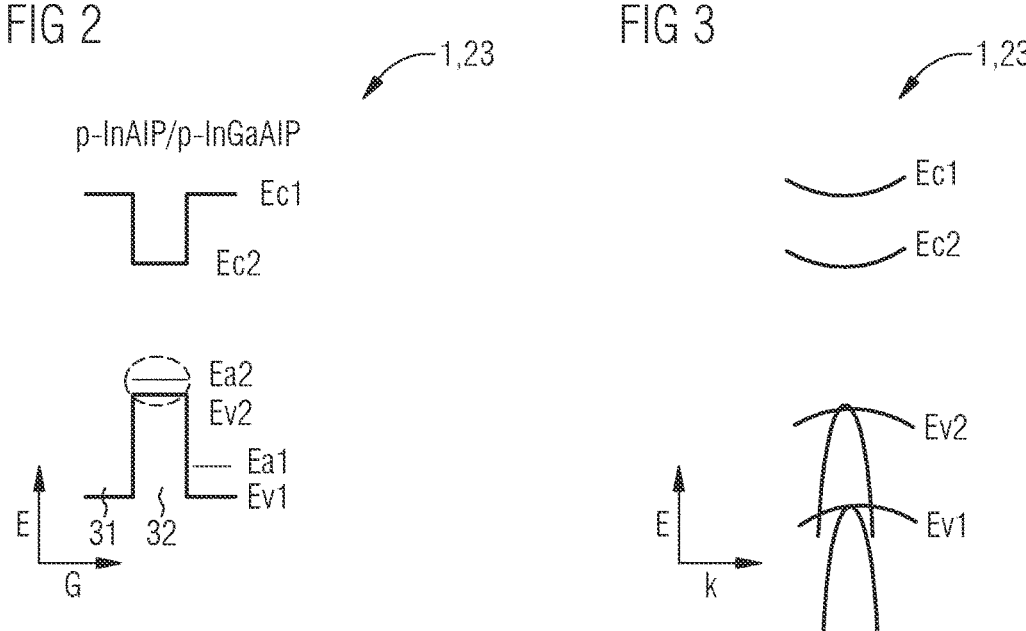

FIG 9
FIG 10
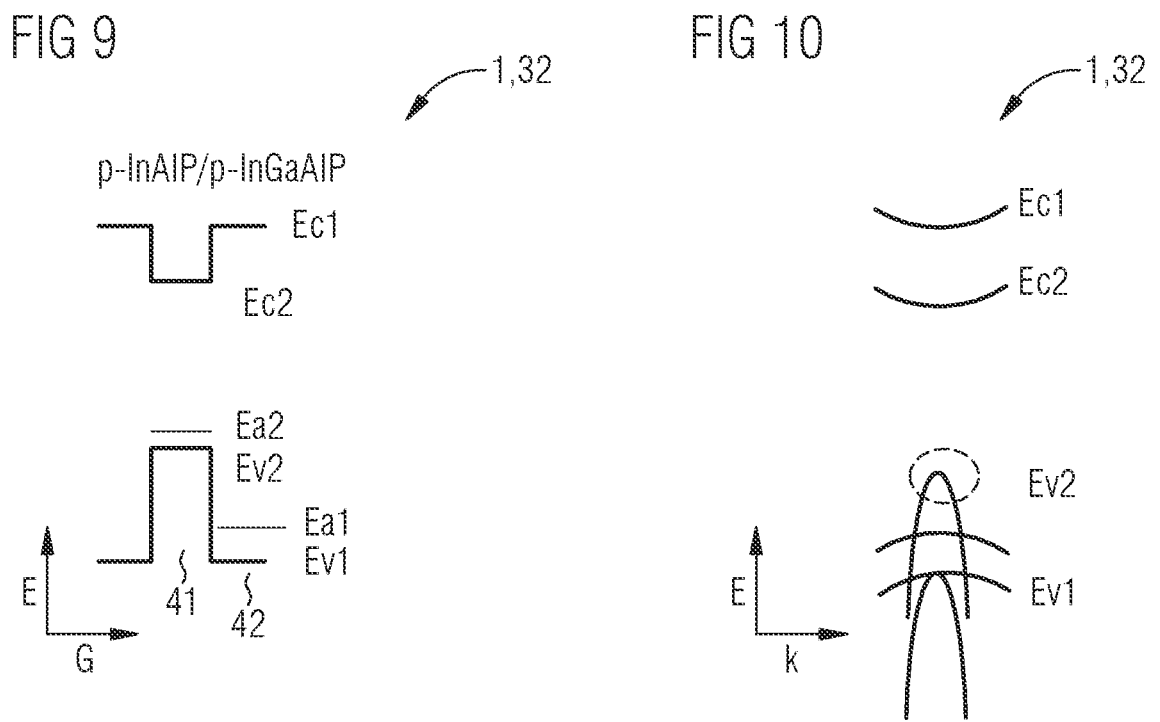
FIG 11
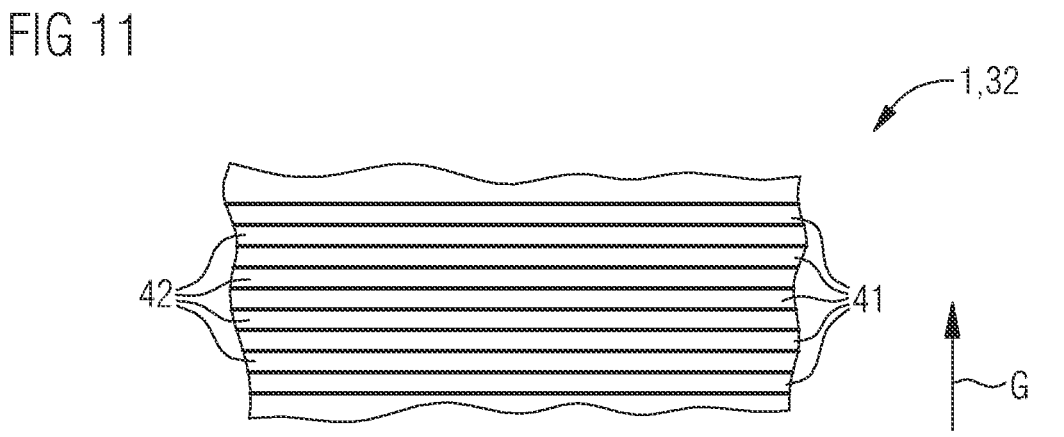

OPTOELECTRONIC SEMICONDUCTOR CHIP

CROSS-REFERENCE TO RELATED APPLICATIONS

This patent application is a national stage entry from International Application No. PCT/EP2020/070332, filed on Jul. 17, 2020, published as International Publication No. WO 2021/013740 A1 on Jan. 28, 2021, and claims priority under 35 U.S.C. § 119 from German patent application 10 2019 119 991.3, filed Jul. 24, 2019, the entire contents of all of which are incorporated by reference herein.

FIELD

An optoelectronic semiconductor chip is specified.

BACKGROUND

An object to be achieved resides in specifying an optoelectronic semiconductor chip which has a high efficiency.

This object is achieved inter alia by means of an optoelectronic semiconductor chip having the features of claim 1. The dependent claims relate to preferred developments.

SUMMARY

In accordance with at least one embodiment, the semiconductor chip comprises a semiconductor layer sequence. The semiconductor layer sequence is preferably grown epitaxially. Particularly preferably, the semiconductor layer sequence is based on the material system InGaAlPAs. That is to say that the semiconductor layers comprise both In and Ga and also Al and P. As is optionally present.

As an alternative to a semiconductor layer sequence composed of InGaAlPAs, in principle it is also possible to use a semiconductor layer sequence having an active zone based on AlInGaN or based on AlInGaAs.

In accordance with at least one embodiment, the semiconductor layer sequence comprises an n-conducting first layer region, a p-conducting second layer region, and an active zone for generating radiation. The active zone is situated between the first and second layer regions. The first layer region can be constructed from a single semiconductor layer or from a plurality of semiconductor layers, wherein said semiconductors can differ from one another in terms of their material composition and/or doping.

The active zone is preferably a multi quantum well structure, also designated as MQW. That is to say that the active zone preferably comprises a plurality of quantum well layers and barrier layers, wherein the quantum well layers and the barrier layers are arranged alternately. The active zone is configured in particular for generating visible light such as red light. Alternatively, near infrared radiation is generated in the active zone.

In accordance with at least one embodiment, the second layer region comprises a first partial region. The first partial region is preferably situated directly at the active zone, in particular in a manner adjoining a last barrier layer of the MQW. The first partial region is composed of p-conducting $In_yAl_{1-y}P$. It is possible for the first partial region and the active zone to be congruent as seen in plan view.

In accordance with at least one embodiment, the second layer region, which is p-doped, comprises a second partial region. Preferably, the second partial region, which is thus likewise p-doped, directly succeeds the first partial region.

The first partial region thus lies within the second layer region and is preferably situated directly between the second partial region and the active zone. The second partial region comprises p-conducting $In_y(Ga_xAl_{1-x})_{1-y}P$ or consists thereof.

In accordance with at least one embodiment, the second layer region comprises a third partial region. Preferably, the third partial region directly succeeds the second partial region, such that the second partial region is situated between the first partial region and the third partial region. The three partial regions are preferably congruent as seen in plan view and thus each have identical extents in a direction perpendicular to a growth direction of semiconductor layer sequence.

In accordance with at least one embodiment, the third partial region is fashioned as a p-type contact layer. That is to say that the third partial region is preferably a last layer of the second layer region, in a direction away from the active zone.

In at least one embodiment, the optoelectronic semiconductor chip comprises a semiconductor layer sequence. The semiconductor layer sequence has an n-conducting first layer region, a p-conducting second layer region, and therebetween an active zone for generating radiation. The second layer region comprises a first partial region directly at the active zone composed of p-conducting $In_yAl_{1-y}P$. Furthermore, the second layer region comprises a second partial region directly at the first partial region comprising p-conducting $In_y(Ga_xAl_{1-x})_{1-y}P$. Furthermore, the second layer region comprises a third partial region as p-type contact layer directly at the second partial region.

Efficient red-emitting light emitting diodes, LEDs for short, can be produced from the semiconductor material InGaAlP. A preferably undoped active zone is composed of InGaAlP in a multi quantum well structure, in which the red light is generated. Said active zone is preferably situated between an n-doped InAlP layer and a p-doped InAlP layer having a large band gap relative to the active zone.

However, p-doped InAlP, in comparison with n-doped InGaAlP, has a poor electrical conductivity. This is owing to very large masses of the holes, in particular, which slows down charge carrier transport. Moreover, there is a limited charge carrier density, in particular of the holes, in p-doped InAlP. This last is primarily down to two reasons: firstly, InAlP can be provided with p-type dopants such as Mg or Zn only to a certain extent. Secondly, a high activation energy barrier is present for holes, and an acceptor atom has to be excited across said barrier toward the valence band.

The relatively low conductivity of p-doped InAlP turns the latter into a significant loss channel, the contribution of which to the total electrical losses of the light emitting diode is approximately 9%, assuming that a 1 μm thick InAlP layer doped with magnesium is present in a thin-film LED having a size of 1 mm². Thin-film means that a growth substrate is removed from the semiconductor layer sequence.

Although a p-doped InAlP layer poses problems, such a layer cannot be completely replaced since otherwise the electron-blocking properties of this p-InAlP layer are lost. As a result, a light emitting diode would become inefficient at medium and high current densities. If only a thickness of the p-InAlP layer is reduced, then relatively high radiation losses occur for example at a C-doped AlGaAs layer or GaP layer as contact layer, which likewise reduces the efficiency of a light emitting diode.

In the case of the semiconductor chip described here, a part of a relatively thick p-InAlP layer otherwise present is replaced by a p-InGaAlP layer. In this case, a band gap of said p-InGaAlP layer is preferably greater than a band gap corresponding to an emission wavelength of the semiconductor chip. This prevents to the greatest possible extent absorption of light generated in the semiconductor chip in the p-InGaAlP layer, such that an optical efficiency of the semiconductor chip remains high. From an electrical standpoint, replacing a part of the p-InAlP layer with p-InGaAlP results in a reduced series resistance of the p-conducting second layer region of the semiconductor chip, which is accompanied by an increased electro-optical efficiency, also referred to as wall plug efficiency or WPE for short.

For example, simulations of a thin-film LED having a light emitting area of 1 mm$^2$, as seen in plan view, exhibit electrical losses of approximately 9% in a 1 μm thick p-InAlP layer, doped with magnesium. These losses result from an energy dissipation owing to Joule heat, caused in particular by the high electrical resistance of p-InAlP:Mg. Proceeding from the data concerning a Hall effect in a model experiment, replacing 50% of the p-InAlP:Mg layer otherwise present with p-In(Ga$_{0.5}$Al$_{0.5}$)P results in a reduction of the electrical resistance by a factor of 2. This results in a reduction of a forward voltage and thus in an increase in the electrooptical efficiency, with no additional absorption of light occurring as a result of the p-InGaAlP layer.

In accordance with one embodiment, a single p-InGaAlP layer is present as second partial region, which layer replaces a part of the thick p-InAlP layer otherwise present at the active zone. The second partial region has a thickness of more than 10 nm, in particular of more than 0.1 μm or 0.3 μm.

In this case, the second partial region preferably has only a small or no lattice mismatch with respect to the underlying LED structure, which preferably has the lattice parameters of a GaAs substrate. In this case, the advantage of the lower resistance of the p-InGaAlP layer is attributed in particular to the lower activation energy of charge carriers, in comparison with p-InAlP. By way of example, the activation energy, Ea for short, for holes in p-InAlP:Mg is 57 meV, whereas this value for p-InGaP is just 20 meV.

In accordance with another embodiment, a plurality of p-InGaAlP layers are present in the second partial region, each of said layers replacing a part of the p-InAlP layer. Each of the p-InGaAlP layers preferably has a thickness of greater than 10 nm, wherein these layers preferably have a small or no mismatch with respect to the lattice structure of the underlying LED layers, in particular no or only a small lattice mismatch with regard to a GaAs substrate.

In accordance with a further embodiment, a plurality of p-InGaAlP layers are present in the second partial region, said layers in turn replacing a part of the p-InAlP layer. Each of the p-InGaAlP layers of the second partial region has a thickness of less than 10 nm. In this case, the advantage of a low activation energy of p-InGaAlP is maintained, wherein an additional advantage can be achieved if these thin p-InGaAlP layer are grown as pseudomorphically strained, in particular tensile-strained.

In this case, an upper edge of a valence band of the tensile-strained p-InGaAlP layers is shaped by a subband of light holes, which allows a higher mobility of the holes within the p-InGaAlP. This results in a reduction of the electrical resistance and thus in an increased electro-optical efficiency if a band gap of the p-InGaAlP is greater than a band gap corresponding to the wavelength of the radiation generated in the active zone during operation.

In accordance with a further embodiment, in the second partial region a plurality of thin p-InGaAlP layers are present, which alternate periodically alternately with thin p-InAlP layers, thus resulting in the formation of one miniband or minibands for holes in the valence band. In this case, an effective mass of the holes in the at least one miniband is less than in bulk p-InGaAlP, which increases a conductivity of such layers. This reduces the series resistance and, in association therewith, the electro-optical efficiency of the semiconductor chip.

In the case of one miniband, the p-InGaAlP layers can be either tensile-strained, compressively strained or unstrained, in particular in relation to GaAs. The p-InAlP layers can either be unstrained or have an opposite strain to the p-InGaAlP layers. That is to say that if the p-InGaAlP layers are tensile-strained, then the p-InAlP layers are compressively strained, and vice versa.

In accordance with at least one embodiment, the following holds true for the p-conducting In$_v$Al$_{1-v}$P of the first partial region: $0.4 \leq v \leq 0.6$ or $0.45 \leq v \leq 0.55$ or $0.47 \leq v \leq 0.52$.

In accordance with at least one embodiment, the following holds true for the p-conducting In$_y$(Ga$_x$Al$_{1-x}$)$_{1-y}$P of the second partial region: $0.2 \leq x$ or $0.4 \leq x$ or $0.4 \leq x$ or $0.5 \leq x$ or $0.6 \leq x$. Alternatively or additionally it holds true that x≤0.95 or x≤0.9 or $0.4 \leq x \leq 0.8$ or x≤0.75. In particular, it holds true that: $0.2 \leq x \leq 0.5$.

In accordance with at least one embodiment, the following holds true for the p-conducting In$_y$(Ga$_x$Al$_{1-x}$)$_{1-y}$P of the second partial region: $0.4 \leq y \leq 0.6$ or $0.45 \leq y \leq 0.55$ or $0.47 \leq y \leq 0.52$.

In accordance with at least one embodiment, the first partial region together with the second partial region has a thickness of at least 0.2 μm or 0.4 μm. Alternatively or additionally, the thickness of the first partial region together with the second partial region is at most 3 μm or 1.8 μm or 1.3 μm or 1 μm.

In accordance with at least one embodiment, a thickness of the first partial region is at least 0.1 μm or 0.2 μm or 0.3 μm. Alternatively or additionally, said thickness is at most 1 μm or 0.6 μm or 0.4 μm or 0.2 μm.

In accordance with at least one embodiment, a thickness of the second partial region is at least 10 nm or 20 nm or 50 nm or 0.3 μm or 0.5 μm. Alternatively or additionally, said thickness is at most 2 μm or 1.5 μm or 1 μm. In particular, the second partial region is thicker than the first partial region by at least a factor of 1.1 or 1.5 or 2.

In accordance with at least one embodiment, a thickness of the third partial region is at least 50 nm or 100 nm or 0.3 μm. Alternatively or additionally, the third partial region has a thickness of at most 1 μm or 0.7 μm or 0.4 μm. Preferably, the third partial region is both thinner than the first partial region and thinner than the second partial region.

In accordance with at least one embodiment, the second partial region consists of a single layer composed of In$_y$(Ga$_x$Al$_{1-x}$)$_{1-y}$P. In this case, it holds true, for example, that the first partial region and the second partial region have an identical thickness, or that the second partial region is thicker than the first partial region by at least a factor of 1.1 or 1.5 and/or by at most a factor of 3 or 2.

In accordance with at least one embodiment, the second partial region is formed by a superlattice comprising a plurality of partial layers composed of p-doped In$_y$(Ga$_x$Al$_{1-x}$)$_{1-y}$P. The superlattice preferably has at least 10 or 20 or 50 layer pairs or periods. Alternatively or additionally, the number of layer pairs or periods is at most 200 or 100.

In accordance with at least one embodiment, the partial layers composed of p-doped In$_y$(Ga$_x$Al$_{1-x}$)$_{1-y}$P are lattice-matched to GaAs. That is to say that a lattice constant of the partial layers deviates from the lattice constant of GaAs, in particular at room temperature, by at most a factor of 1.004 or 1.002 or 1.001. In this case, the partial layers preferably have a thickness of at least 10 nm or 15 nm or 20 nm and/or of at most 100 nm or 50 nm or 25 nm.

In accordance with at least one embodiment, the super-lattice has a plurality of barrier layers arranged alternately with respect to the $In_y(Ga_xAl_{1-x})_{1-y}P$ partial layers. The barrier layers are preferably composed of p-doped $In_w$ $Al_{1-w}P$. In this case, it preferably holds true that $0.4 \leq w \leq 0.6$ or $0.45 \leq w \leq 0.55$ or $0.47 \leq w \leq 0.52$. Particularly in the case of partial layers having a thickness of at most 20 nm and/or of at least 6 nm, a thickness of the barrier layers deviates from a thickness of the partial layers by at most a factor of 2 or 1.5 or 1.2. That is to say that the barrier layers and the partial layers can have an approximately identical thickness in this case.

In accordance with at least one embodiment, the partial layers are tensile-strained vis à vis GaAs. That is to say that a lattice constant of the partial layers composed of p-doped $In_y(Ga_xAl_{1-x})_{1-y}P$, particularly at room temperature, is less than the lattice constant of GaAs by at least a factor or 1.002 or 1.005 or 1.02. In this case, the partial layers preferably each have a thickness of at most 10 nm or 8 nm or 6 nm, wherein a thickness of the partial layers is preferably at least 2 nm or 3 nm or 4 nm.

In the case particularly of the embodiment mentioned directly above, the barrier layers are significantly thicker than the partial layers. By way of example, a thickness of the barrier layers is then greater than the thickness of the partial layers by at least a factor of 1.5 or 2 or 2.5 and/or by at most a factor of 10 or 5 or 3.

In accordance with at least one embodiment, the super-lattice has a miniband structure, such that an effective band gap between a valence band and a conduction band lies between a band gap of the partial layers composed of p-doped $In_y(Ga_xAl_{1-x})_{1-y}P$ and a band gap of barrier layers, which in particular are composed of p-doped $In_xAl_{1-w}P$.

In accordance with at least one embodiment, the partial layers and/or the barrier layers have a thickness of at least 2 nm or 3 nm or 4 nm. Alternatively or additionally, the thickness of the partial layers and/or of the barrier layers is at most 10 nm or 8 nm or 6 nm. In particular, the partial layers and the barrier layers have thicknesses of between 3 nm and 6 nm inclusive.

In accordance with at least one embodiment, the third partial region fashioned as a p-type contact layer is com-posed of GaP, composed of GaAs and/or composed of AlGaP, comprising both Al and Ga and P. A p-type doping is attained in particular by way of C, Mg and/or Zn. The p-type contact layer can be a single layer, or the third partial region is composed of a plurality of layers, preferably at most four layers, in particular exactly two layers.

In accordance with at least one embodiment, in a direction away from the active zone the third partial region is directly followed by a second electrode layer. The second electrode layer can comprise a partial layer composed of a transparent conductive oxide directly at the third partial region. Prefer-ably, the second electrode layer comprises at least one metallic layer or consists overall of one or of a plurality of metallic layers.

In accordance with at least one embodiment, a first electrode layer is situated at the p-conducting first layer region in places or over the whole area.

It is possible for the semiconductor chip to comprise prismatic structures for refracting light and for delimiting energization regions of the active zone, in particular at the side with the first electrode layer. Alternatively or addition-ally, a roughening for increasing a light output coupling efficiency can be situated at the side with the second electrode layer, i.e. at or in the second layer region.

In accordance with at least one embodiment, an average band gap of the second partial region is greater than an average band gap of the active zone, or than an energy corresponding to a wavelength of maximum intensity of the radiation generated in the active zone, by at least a factor of 1.05 or 1.1 and/or by at most a factor of 1.33 or 1.25.

In accordance with at least one embodiment, the semi-conductor chip is a light emitting diode chip, LED chip for short. In this case, in the active zone preferably red light is generated, for example with a wavelength of maximum intensity of at least 595 nm or 610 nm and/or of at most 665 nm or 645 nm or 638 nm.

In accordance with at least one embodiment, the n-con-ducting first layer region comprises n-doped InAlP or con-sists of n-doped InAlP. That is to say that the first layer region can be formed by a single layer. Alternatively, the first layer region, in particular toward the first electrode layer, comprises further layers, such as a contact layer or a buffer layer, which lie in particular at a side with a growth substrate or at a side from which a growth substrate for the semicon-ductor layer sequence was removed.

An optoelectronic semiconductor chip described here is explained in greater detail below on the basis of exemplary embodiments with reference to the drawing. In this case, identical reference signs indicate identical elements in the individual figures. In this case, however, relations to scale are not illustrated; rather, individual elements may be illus-trated with exaggerated size in order to afford a better understanding.

BRIEF DESCRIPTION OF THE DRAWINGS

In the figures:

FIG. 1 shows a schematic sectional illustration of one exemplary embodiment of an optoelectronic semiconductor chip described here, FIGS. 2 to 4 show schematic illustrations of energy levels of the optoelectronic semiconductor chip from FIG. 1, FIGS. 5 to 7 show schematic illustrations of energy levels of a modification of a semiconductor chip, FIGS. 9 and 10 show schematic illustrations of energy levels of the semiconductor chip from FIG. 8, FIG. 11 shows a schematic sectional illustration of one exemplary embodiment of an optoelectronic semiconductor chip described here.

DETAILED DESCRIPTION

Figure 4:
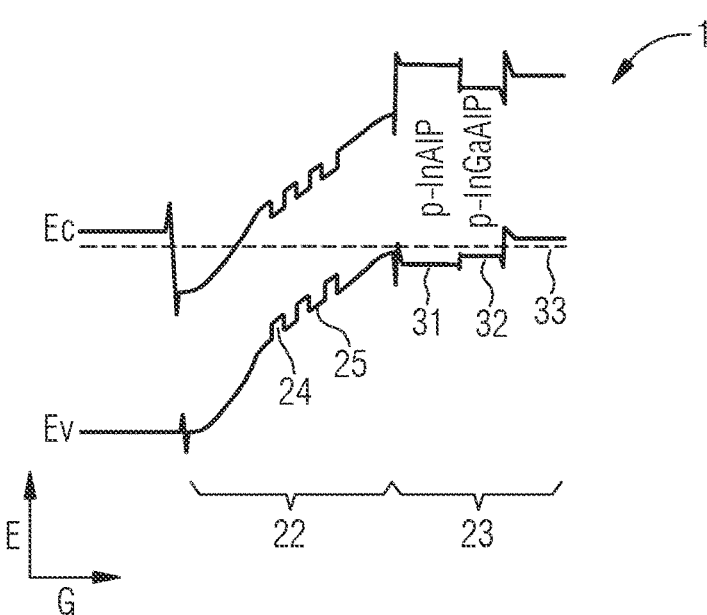

FIG. 1 shows one exemplary embodiment of an optoelec-tronic semiconductor chip 1. The semiconductor chip 1 is a light emitting diode chip and comprises a semiconductor layer sequence 2 based on the material system InGaAlP or InGaAlPAs.

The semiconductor layer sequence 2 comprises an n-con-ducting first layer region 21, a p-conducting second layer region 23 and, therebetween, an active zone 22 for gener-ating radiation, preferably for generating red light. In FIG. 1, the n-conducting first layer region 21 is formed by a single layer, but can alternatively also be composed of a plurality layers. The active zone 22 is a multi quantum well structure, MQW for short, which is composed alternately of barrier layers 25 and quantum well layers 24.

The p-conducting second layer region 23 is composed of a first partial region 31, a second partial region 32 and a third partial region 33. Along a growth direction G of the semiconductor layer sequence, these partial regions 31, 32, 33, in a direction away from the active zone 22, succeed one another directly and preferably over the whole area in each case.

The first partial region 31 is composed of InAlP and the second partial region is composed of a single layer composed of InGaAlP. Either the partial regions 31, 32 have an approximately identical thickness or the second partial region 32 is thicker than the first partial region 31. The third partial region 33 is fashioned as a semiconductor contact layer and consists either of exactly one layer or, as symbolized by a dashed line in FIG. 1, of two layers.

For the energization of the semiconductor layer sequence 2, a first electrode layer 51 is situated at the first layer region 21 and a second electrode layer 52 is situated at the second layer region 23. By way of example, the second electrode layer 52 is composed of a TCO layer 53 and of a metallization 54. TCO stands for transparent conductive oxide, for example ITO or ZnO. The first electrode layer 51 is fashioned for example as a mirror layer, in particular as a combination mirror with a layer composed of a low refractive index material, through which perforations of a metallization can extend, not depicted in FIG. 1.

As also in all the exemplary embodiments, it is optionally possible for a growth substrate to have been removed from the semiconductor layer sequence 2 and for the semiconductor layer sequence 2 to be fitted on a carrier 6. The carrier 6 is composed in particular of a semiconductor material such as Si, of a ceramic such as $Al_2O_3$ or of a metal such as Mo. Optionally present prismatic structures at the first electrode layer 51 and/or light output coupling structures at the second layer region 23 are not depicted in FIG. 1 for the sake of simplifying the illustration.

FIGS. 2 to 4 schematically show various illustrations concerning energy levels of the semiconductor chip 1 from FIG. 1. The second layer region 23 is illustrated in a simplified manner in FIG. 2, wherein an energy E is plotted against the growth direction G. The energy levels Ec1, Ec2 of the conduction band and Ev1, Ev2 of the valence band are shown. The activation energy levels Eat, Eat are additionally depicted, with the numbering 1 respectively for p-InAlP and with the numbering 2 respectively for p-InGaAlP. In FIG. 3, the energy E is plotted against a wave vector or a wave number k.

In FIG. 4 the energy E is plotted against the growth direction G for a larger region of the semiconductor layer sequence 2. As a result of the smaller band gap in the region of the p-InGaAlP layer 32, the series resistance is able to be reduced, on account of the better electrical conductivity of InGaAlP relative to InAlP.

By way of example, the following holds true for the semiconductor layer sequence 2:

the n-conducting first layer region 21 is composed of $In_zAl_{1-z}P$ where $0.49 \leq x \leq 0.51$, doped with Te or Si, in the active zone 22 the quantum well layers 24 are composed of $In_a(Ga_{1-b}Al_b)_{1-a}P$ where $0.49 \leq a \leq 0.7$ and $0 \leq b \leq 0.5$ or $0 < b \leq 0.50$ and the barrier layers 25 are composed of $In_c(Ga_{1-d}Al_d)_{1-c}P$ where $0.49 \leq c \leq 0.51$ and $0.2 \leq d \leq 0.7$), the first layer region 31 is composed of p-$In_vAl_{1-v}P$ where $0.49 \leq v \leq 0.51$, doped with Mg or Zn, the second partial region 32 is composed of p-$In_y(Ga_{1-x}Al_x)_{1-y}P$ where $0.49 \leq y \leq 0.51$ and for example where $0.2 \leq x \leq 0.5$, doped with Te or Si, and the third partial region 33 is composed of the layer pair $Al_gGa_{1-g}As:C/GaAs:C$ where $0.45 \leq g \leq 0.9$ or of a layer composed of $Al_hGa_{1-h}P:C$ where $0 \leq h \leq 0.5$ or $0 < h \leq 0.5$.

Figure 5:
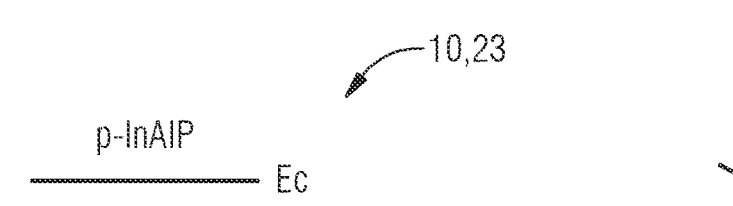
Figure 6:
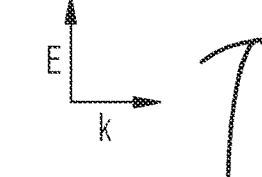
Figure 7:
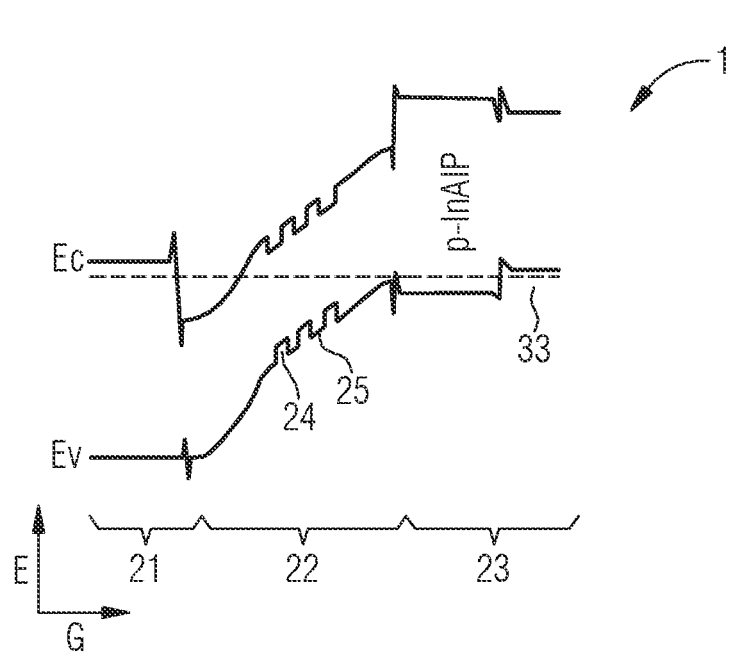

FIGS. 5 to 7 illustrate energy profiles for a modification 10 of the semiconductor chip. In this modification 10, see FIG. 7 in particular, no InGaAlP layer is present in the second layer region 23. As a result, see FIGS. 5 and 6 in comparison with FIGS. 2 and 3 concerning the semiconductor component 1 described here, the acceptor level Ea is further away from the energy level Ec of the conduction band. Overall this results in a lower charge carrier mobility in the second layer region 23, as a result of which an electrical series resistance increases and the electro-optical efficiency of the modification 10 is lower than in the case of the semiconductor chip 1, as illustrated in FIGS. 1 to 4.

Figure 8:
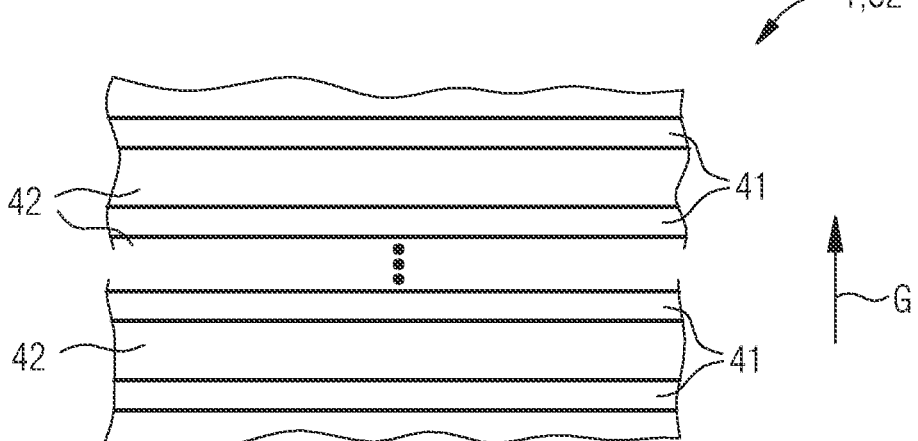
FIG. 8 shows a schematic sectional illustration of one exemplary embodiment of an optoelectronic semiconductor chip described here.

FIG. 8 illustrates a further exemplary embodiment of the semiconductor chip 1, with only the second partial region 32 being depicted. In this case, the second partial region 32 is composed of a plurality of alternately arranged partial layers 41 composed of InGaAlP and barrier layers 42 composed of InAlP. That is to say that the second partial region 32 is fashioned as a superlattice. Only four of the partial layers 41 are illustrated by way of example in FIG. 8. Preferably approximately 70 of the partial layers 41 and thus approximately 70 layer pairs or periods of the superlattice are present.

The partial layers 41 are preferably tensile-strained, in particular relative to a GaAs lattice. A thickness of the partial layers 41 is preferably less than 10 nm. In this configuration, the barrier layers 42 of the superlattice are thicker than the partial layers 41. A quotient of a thickness of the barrier layers 42 and a thickness of the partial layers 41 is in particular between 3 and 5 inclusive.

As an alternative to relatively thin partial layers 41 and thick barrier layers 42, relatively thick InGaAlP partial layers 41 having a thickness of more than 10 nm can also be present in the construction in FIG. 8. In this case, the partial layers 41 are preferably not, or not significantly, lattice mismatched vis A vis GaAs. Furthermore, in this case, the barrier layers 42 are approximately as thick as the partial layers 41.

FIGS. 9 and 10 relate to the last-mentioned configuration, that is to say to relatively thick partial layers 41 having a thickness of more than 10 nm, which are unstrained vis àvis GaAs.

For the rest, the explanations concerning FIGS. 1 to 4 are applicable, mutatis mutandis, to FIGS. 8 to 9, that is to say to the configurations with a partial region 32 which is fashioned as a superlattice and which has thick partial layers 41 in combination with barrier layers 42 having an approximately identical thickness or which has thin partial layers 41 in combination with relatively thick barrier layers 42.

In the exemplary embodiment in FIG. 11, both the partial layers 41 and the barrier layers 42 are made thin in each case, only the second partial region 32 being illustrated in FIG. 11. With regard to the rest of components of the semiconductor chip 1 in FIG. 11, the explanations concerning FIGS. 1 to 4 are applicable, mutatis mutandis.

Figure 12:
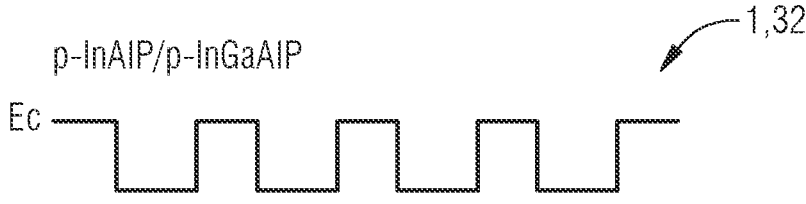
FIGS. 12 and 13 show schematic illustrations of energy levels of the semiconductor chip from FIG. 11.
Figure 12:
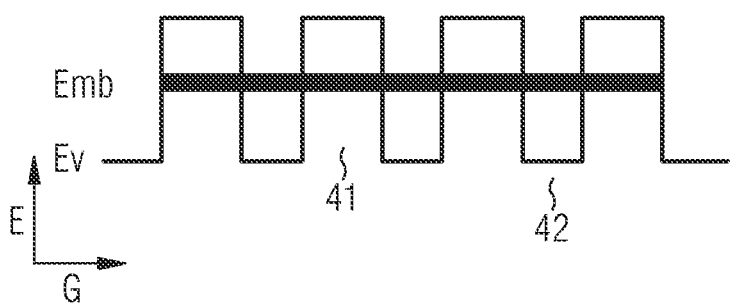

The partial layers 41 and the barrier layers 42 have for example in each case a thickness of between 3 nm and 6 nm inclusive and are thus relatively thin in each case. This results in a miniband with an effective energy level $E_{mB}$ for the holes; see also FIG. 12. An effective mass of holes in the miniband is less than in thick, bulk p-InGaAlP, and so a higher conductivity is attained. The superlattice having the thin partial layers 41 and barrier layers 42 preferably has between 50 and 200 layer pairs inclusive.

Figure 13:
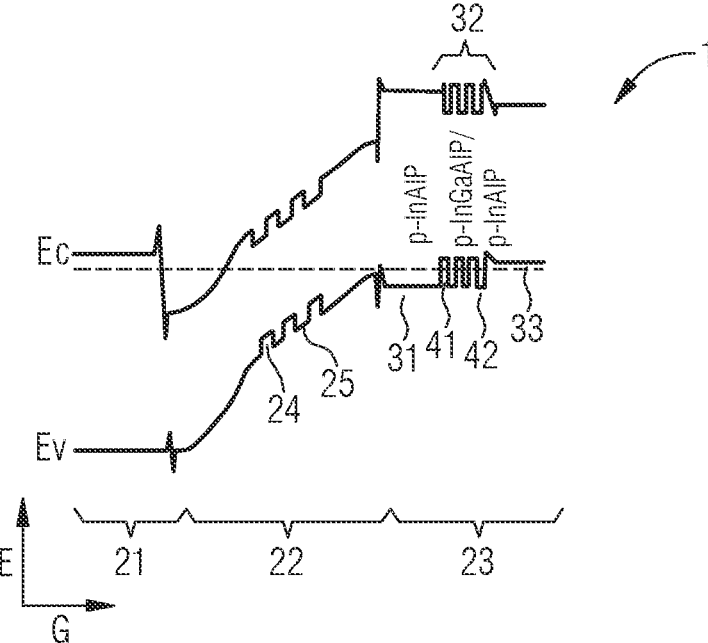

FIG. 13 illustrates once again the band structure of the layer regions 21, 23 and of the active zone 22, in particular for the case of FIG. 8. The second partial region 32 comprises in particular in the following layers 41, 42:

the superlattice partial layers 41 are composed of $In_y(Ga_{1-x}Al_x)_{1-y}P$, doped with Mg or Zn and where $0.49 \leq y \leq 0.51$ for non-strained partial layers 41 and where $0.3 \leq y \leq 0.49$ for tensile-strained partial layers, and also where $0.2 \leq x \leq 0.5$, the superlattice barrier layers 42 are composed of $In_w Al_{1-w}P$, doped with Mg or Zn, wherein $0.49 \leq w \leq 0.51$ holds true for non-strained barrier layers and $0.51 \leq x \leq 0.8$ holds true for compressively strained barrier layers.

Unless indicated otherwise, the components shown in the figures succeed one another preferably in the specified order and in particular directly. Layers not touching one another in the figures are preferably spaced apart from one another. Insofar as lines are depicted parallel to one another, the corresponding areas are preferably likewise aligned parallel to one another. Likewise, unless indicated otherwise, the positions of the depicted components relative to one another are rendered correctly in the figures.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising a semiconductor layer sequence having:

an n-conducting first layer region, a p-conducting second layer region, and an active zone for generating radiation between the first and second layer regions, wherein the second layer region comprises:

a first partial region directly at the active zone composed of p-conducting $In_v Al_{1-v}P$, wherein a thickness of the first partial region is at least 0.3 μm and at most 1 μm, a second partial region directly at the first partial region and formed by a superlattice comprising a plurality of partial layers composed of p-conducting $In_y(Ga_x Al_{1-x})_{1-y}P$, wherein $0.4 \leq x \leq 0.9$ or $0.2 \leq x \leq 0.5$, and $0.4 \leq y \leq 0.6$, and wherein the superlattice has between 20 and 100 periods inclusive, and a third partial region as p-type contact layer directly at the second partial region, wherein a thickness of the third partial region is at most 0.7 μm.

2. The optoelectronic semiconductor chip as claimed in claim 1, wherein $0.4 \leq v \leq 0.6$, a thickness of the second partial region is at least 0.01 μm and at most 1.5 μm, and a thickness of the third partial region is at least 0.05 μm and at most 0.7 μm.

3. The optoelectronic semiconductor chip as claimed in claim 1, wherein the partial layers are lattice-matched to GaAs, such that a lattice constant of the partial layers deviates from the lattice constant of GaAs at room temperature by at most a factor of 1.002, wherein the partial layers each have a thickness of at least 10 nm.

4. The optoelectronic semiconductor chip as claimed in claim 3, wherein in the second partial region the partial layers and barrier layers composed of p-doped $In_w A_{1-w}P$ where $0.4 \leq w \leq 0.6$ are arranged alternately with respect to one another, wherein a thickness of the barrier layers deviates from the thickness of the partial layers by at most a factor of 2.

5. The optoelectronic semiconductor chip as claimed in claim 1, wherein the partial layers are tensile-strained vis à vis GaAs, such that a lattice constant of the partial layers at room temperature is less than the lattice constant of GaAs by at least a factor of 1.005, wherein the partial layers each have a thickness of at most 10 nm.

6. The optoelectronic semiconductor chip as claimed in claim 5, wherein in the second partial region the partial layers and barrier layers composed of p-doped $In_w A_{1-w}P$ where $0.4 \leq w \leq 0.6$ are arranged alternately with respect to one another, wherein a thickness of the barrier layers is greater than the thickness of the partial layers by at least a factor of 1.5 and by at most a factor of 5.

7. The optoelectronic semiconductor chip as claimed in claim 1, wherein the superlattice has a miniband structure, such that an effective band gap between a valence band and a conduction band lies between a band gap of the partial layers composed of p-doped $In_y(Ga_x Al_{1-x})_{1-y}P$ and a band gap of barrier layers composed of p-doped $In_w Al_{1-w}P$ where $0.4 \leq w \leq 0.6$.

8. The optoelectronic semiconductor chip as claimed in claim 7, wherein the partial layers and the barrier layers each have a thickness of between 2 nm and 8 nm inclusive.

9. The optoelectronic semiconductor chip as claimed in claim 1, wherein the third partial region fashioned as a p-contact layer is composed of GaP, composed GaAs and/or composed of AlGaP and is doped with C, Mg and/or Zn.

10. The optoelectronic semiconductor chip as claimed in claim 1, wherein in a direction away from the active zone the third partial region is directly followed by a second electrode layer, wherein the second electrode layer is composed of at least one transparent conductive oxide and/or metal, and wherein a first electrode layer is situated at the n-conducting first layer region.

11. The optoelectronic semiconductor chip as claimed in claim 1, wherein an average band gap of the second partial region is greater than an average band gap of the active zone by at least a factor of 1.05 and by at most a factor of 1.5.

12. The optoelectronic semiconductor chip as claimed in claim 1, which is a light emitting diode chip, wherein the active zone is configured for generating red light and the n-conducting first layer region comprises n-doped InAlP or is composed of n-doped InAlP.

13. The optoelectronic semiconductor chip as claimed in claim 1, wherein the second partial region is thicker than the first partial region by at least a factor of 1.1 and at most a factor of 3.

14. The optoelectronic semiconductor chip as claimed in claim 1, wherein a thickness of the second partial region is at least 0.3 μm and at most 1.5 μm.

15. The optoelectronic semiconductor chip as claimed in claim 1, wherein a thickness of the second partial region is at least 0.5 μm and at most 1.5 μm.

16. The optoelectronic semiconductor chip as claimed in claim 1, wherein a thickness of the third partial region is at least 0.3 μm and at most 0.7 μm.

17. An optoelectronic semiconductor chip comprising a semiconductor layer sequence having:

an n-conducting first layer region, a p-conducting second layer region, and an active zone for generating radiation between the first and second layer regions, wherein the second layer region comprises:

a first partial region directly at the active zone composed of p-conducting $In_xAl_{1-x}P$, wherein a thickness of the first partial region is at least 0.3 μm and at most 1 μm, a second partial region directly at the first partial region and consisting of a single layer composed of p-conducting $In_y(Ga_xAl_{1-x})_{1-y}P$, wherein $0.4 \leq x \leq 0.9$ and $0.4 \leq y \leq 0.6$, and a third partial region as p-type contact layer directly at the second partial region, wherein a thickness of the third partial region is at most 0.7 μm, and wherein the optoelectronic semiconductor chip is a light emitting diode chip, and the active zone is configured for generating red light.

18. The optoelectronic semiconductor chip as claimed in claim 17, wherein a thickness of the second partial region is at least 0.3 μm and at most 1.5 μm.

19. The optoelectronic semiconductor chip as claimed in claim 17, wherein a thickness of the second partial region is at least 0.5 μm and at most 1.5 μm.

20. The optoelectronic semiconductor chip as claimed in claim 17, wherein a thickness of the third partial region is at least 0.3 μm and at most 0.7 μm.

* * * * *